United States Patent
Li et al.

(10) Patent No.: US 7,260,163 B2
(45) Date of Patent: Aug. 21, 2007

(54) NOISE BLANKER USING AN ADAPTIVE ALL-POLE PREDICTOR AND METHOD THEREFOR

(75) Inventors: Junsong Li, Austin, TX (US); Ronald Wang, Jiangsu (CN); Raghu G. Raj, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 781 days.

(21) Appl. No.: 10/216,333

(22) Filed: Aug. 9, 2002

(65) Prior Publication Data

US 2004/0203551 A1 Oct. 14, 2004

(51) Int. Cl.
*H04B 1/10* (2006.01)

(52) U.S. Cl. ............... 375/350; 375/346; 375/351; 375/254; 329/318; 329/319; 329/320; 329/349; 702/17; 702/191; 702/195; 455/501; 455/63.1; 455/570; 455/114.2; 381/317; 381/71.1; 381/73.1; 381/94.1

(58) Field of Classification Search ........ 375/350, 375/351, 316, 254, 346; 455/297, 501, 63.1, 455/570, 114.2, 223, 296; 329/318–320, 329/349, 353; 702/17, 191, 195; 381/317, 381/71.1, 73.1, 94.1

See application file for complete search history.

(56) References Cited

U.S. PATENT DOCUMENTS 4,528,678 A * 7/1985 Udren ................ 375/351
4,672,665 A * 6/1987 Nagai et al. ........... 379/406.11
5,535,280 A 7/1996 Chahabadi et al.
5,537,675 A * 7/1996 Bond ................ 455/223
5,661,795 A * 8/1997 Maeda .............. 379/412
5,890,059 A * 3/1999 Shoemaker et al. ....... 455/297
6,181,753 B1 * 1/2001 Takada et al. .......... 375/346
6,418,159 B1 * 7/2002 Umemoto ............ 375/219
6,426,983 B1 * 7/2002 Rakib et al. .......... 375/346
6,459,727 B1 * 10/2002 Cho et al. ............ 375/222
6,570,986 B1 * 5/2003 Wu et al. ............ 379/406.09
6,628,788 B2 * 9/2003 Azizi ................ 381/57
6,937,978 B2 * 8/2005 Liu .................. 704/228
2003/0039327 A1 * 2/2003 Suganuma ............ 375/350

OTHER PUBLICATIONS

Hayes, "Statistical Digital Signal Processing and Modeling," Wiley & Sons, Inc. pp. 160-165 (1996).

* cited by examiner

*Primary Examiner*—Mohammed Ghayour
*Assistant Examiner*—Leila Malek
(74) *Attorney, Agent, or Firm*—Daniel D. Hill; Robert L. King

(57) ABSTRACT

A noise blanker (40, 106) monitors and removes noise from a sampled signal by adaptive filtering (98, 150) the sampled signal to generate trained adaptive filter prediction coefficients. The sampled signal is provided as an output signal when the noise blanker is in a training mode. A noise monitor (34, 154) detects whether noise contained within the sampled signal exceeds a predetermined threshold and provides a control signal in response to the detecting. The noise blanker is placed in a prediction mode for a predetermined amount of time in response to asserting the control signal. A prediction output signal is generated using a plurality of prediction coefficients as an all-pole filter. The prediction output signal has minimal noise content.

5 Claims, 4 Drawing Sheets

NOISE BLANKER USING AN ADAPTIVE ALL-POLE PREDICTOR AND METHOD THEREFOR

FIELD OF THE INVENTION

The present invention relates generally to noise blankers and more specifically to noise blankers using an adaptive all-pole predictor and method thereof.

RELATED ART

Automobile engines generate ignition noise that can be picked by radio receivers. The ignition noise is typically in the form of broadband spikes that cause audible effects that can be heard on the radio speakers. The frequency of ignition noise can be within a range of about zero hertz (Hz) to about 6 kilo hertz (KHz). When a received RF signal is relatively strong, ignition noise effects are negligible. A noise blanker is included in radios to reduce the effects of ignition noise. When a received RF signal is weak, effects of the ignition noise are more significant. When the RF level is very low, too much miss firing of the FM blanker may also cause audible effects. Non-ideal radio channel effects will affect the performance of an FM noise blanker, such as adjacent interference, multipath echo, etc. Some prior art noise blankers use previously stored samples to substitute for noise-corrupted samples. However, this technique for removing noise spikes reduces fidelity of the audio signal. Therefore, it would be desirable to have a radio receiver that removes noise spikes without affecting the fidelity of the audio signal.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides a noise controller that reduces the effect of ignition noise on a received FM signal by using an all-pole prediction algorithm to generate a predicted signal segment to replace the noise-corrupted signal segment. The all-pole prediction algorithm takes a sample of a previously demodulated signal and models a new demodulated signal segment using the all-pole prediction algorithm. The all-pole prediction algorithm uses includes a least means squared (LMS) algorithm to minimize error between the received original signal and the predicted signal. Using an all-pole prediction algorithm to predict a new demodulated signal segment to replace the noise corrupted segment provides higher fidelity over prior art noise blankers. Using an LMS algorithm to minimize prediction error allows the all-pole predictor to be more easily implemented compared to the traditional all-pole prediction technique that requires a calculation of second-order statistics and matrix inverse.

Figure 1:
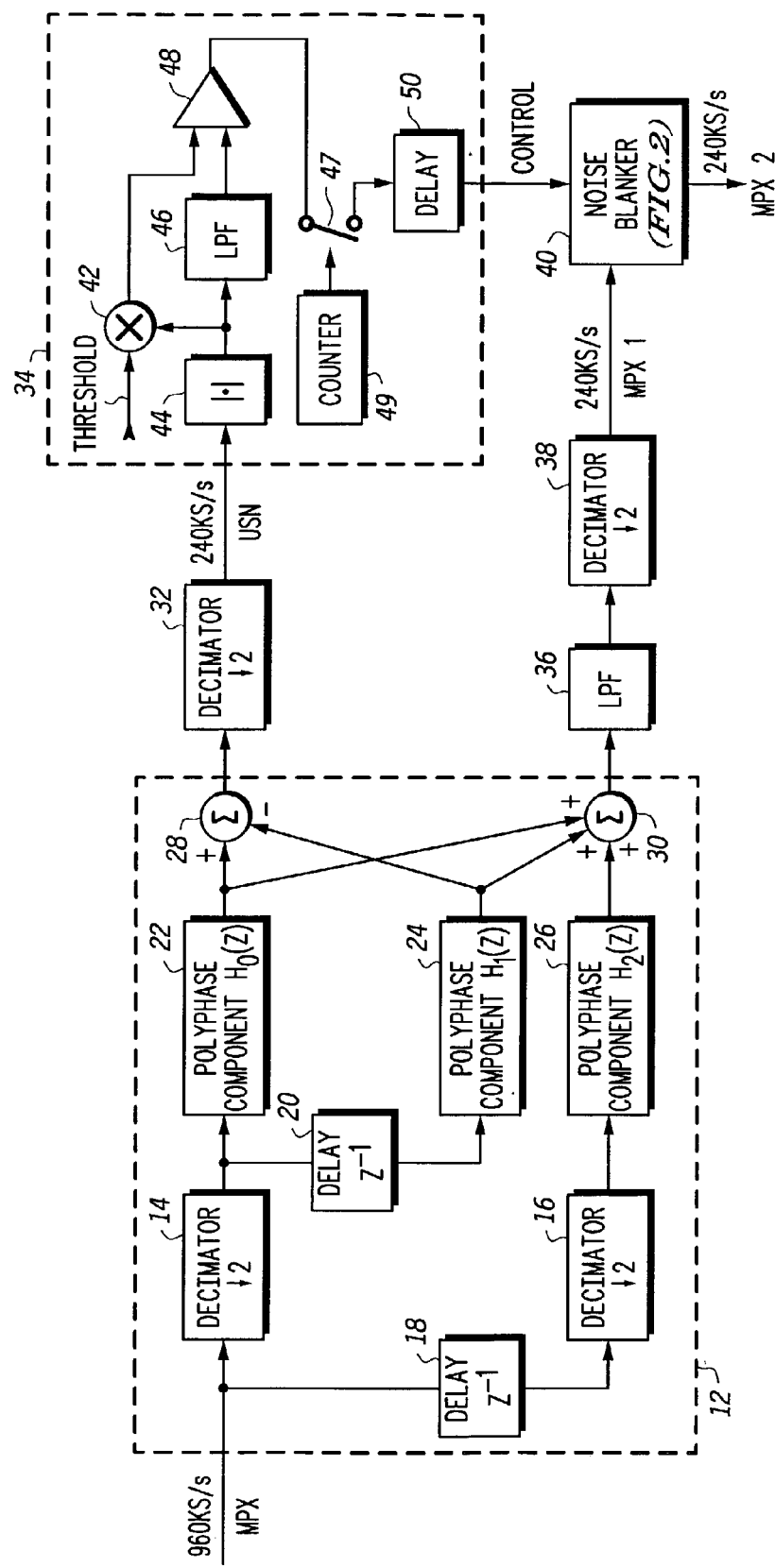
FIG. 1 illustrates, in block diagram form, a noise controller in accordance with one embodiment of the present invention.

FIG. 1 illustrates, in block diagram form, noise controller 10 in accordance with one embodiment of the present invention. Noise controller 10 includes modified polyphase filter 12, decimator 32, noise detector 34, low pass filter (LPF) 36, decimator 38, and noise blanker 40. Modified polyphase filter 12 includes decimators 14 and 16, polyphase components 22, 24, and 26, delay elements 18 and 20, and summation elements 28 and 30. Noise detector 34 includes multiplier 42, absolute value calculator 44, LPF 46, comparator 48, counter 49, switch 47, and delay element 50.

Noise controller 10 receives a multiplex signal MPX at a sample rate of 960 KS/s. The multiplex signal MPX corresponds to a received FM signal that may be corrupted with ignition noise. Within noise controller 10, the MPX signal is received at an input of decimator 14 which downsamples, or divides, the sample rate of the MPX signal by two. The MPX signal is also provided to decimator 16 via delay element 18. Decimator 16 also downsamples the MPX signal by two. Polyphase component 22 has an input coupled to an output of decimator 14, and an output coupled to an input terminal of summation element 28. Polyphase component 24 has input coupled to the output of decimator 14 via delay element 20. An output of polyphase component 24 is provided to inputs of both of summation elements 28 and 30. Polyphase component 26 has an input coupled to an output of decimator 16, and an output coupled to an input of summation element 30. As indicated in FIG. 1, summation element 28 subtracts the output of polyphase component 24 from the output of polyphase component 22 and provides the result as an input to decimator 32. Summation element 30 adds the outputs of all of polyphase components 22, 24, and 26 and provides the result to LPF 36.

A conventional polyphase filter for decimation by two is implemented using the following equation:

$$H(z) = h_0 + h_1 z^{-1} + h_2 z^{-2} + \ldots + h_{2N} z^{-2N} + h_{2N+1} z^{-(2N+1)}$$

$$= \hat{H}_0(z^2) + z^{-1} H_2(z^2)$$

where
$\hat{H}_0(z) = h_0 + h_2 z^{-1} + \ldots + h_{2N} z^{-N}$
$H_2(z) = h_1 + h_3 z^{-1} + \ldots + h_{2N+1} z^{-N}$ The $0^{th}$ polyphase component of the decimation filter can be further decomposed as following, $$\hat{H}_0(z) = h_0 + h_2 z^{-1} + \ldots + h_{2N} z^{-N}$$

$$= H_0(z) + z^{-1} H_1(z)$$

where
$H_0(z) = h_0 + h_4 z^{-1} + h_8 z^{-1} \ldots$
$H_1(z) = h_2 + h_6 z^{-1} + h_{10} z^{-1} \ldots$ Polyphase filter 12 is modified to obtain a bandpass filter to extract USN information, and the original lowpass filter is modulated by $\cos(\pi n/2)$ in order to frequency-shift this lowpass filter to a high enough frequency. The resultant bandpass filter plus decimation by two can be represented by the following equation:

$$H_{BPF}(z) = \hat{H}_0(ze^{i\pi n}) = H_0(z) - z^{-1}H_1(z)$$

USN information can be extracted using the modified poly-phase decimation structure with only one more subtraction. This reduces DSP implementation cost compared to the case that an extra bandpass filter has to be implemented to obtain USN (ultrasonic noise) signal.

The output of decimator 32 is a 240 KS/s signal having an ultrasonic noise component labeled "USN". The USN signal is inputted to noise detector 34. Noise detector 34 uses the USN signal to detect the occurrence of noise above a predetermined threshold. To detect noise, the USN signal is first provided to absolute value calculator 44 and is lowpass filtered by LPF 46. A noise threshold value labeled THRESHOLD is multiplied by the output of absolute value calculator 44 and provided as an input to comparator 48. The output of LPF 46 is provided as a second input to comparator 48. Comparator 48 compares the noise threshold to the absolute value. If the signal output of multiplier 42 is lower than the output of LPF 46, a noise spike is detected. Otherwise, a noise spike is not detected.

The output of summation element 30 is lowpass filtered by LPF 36 and downsampled by two using decimator 38 to provide a signal labeled "MPX1". The MPX1 signal is provided as an input to noise blanker 40. Also, a control signal labeled "CONTROL" is provided by noise detector 34 via delay element 50. When activated by the control signal CONTROL, noise blanker 40 generates a new predicted signal, that was generated during a training mode of noise blanker 40, and substitutes the new predicted signal for the noisy signal. This has the effect of removing the noise spike from the MPX1 signal, and providing a corresponding MPX signal labeled "MPX2" with a relatively small amount of signal distortion. When a spike is detected, the output of comparator 48 will be provided to switch 47. Switch 47 is controlled by counter 49 and prevents another spike from activating noise blanker 40 before a predetermined time as indicated by a preprogrammed count value in counter 49. Counter 49 and switch 47 are provided because blanking too frequently will cause significant distortion in the signal.

Figure 2:
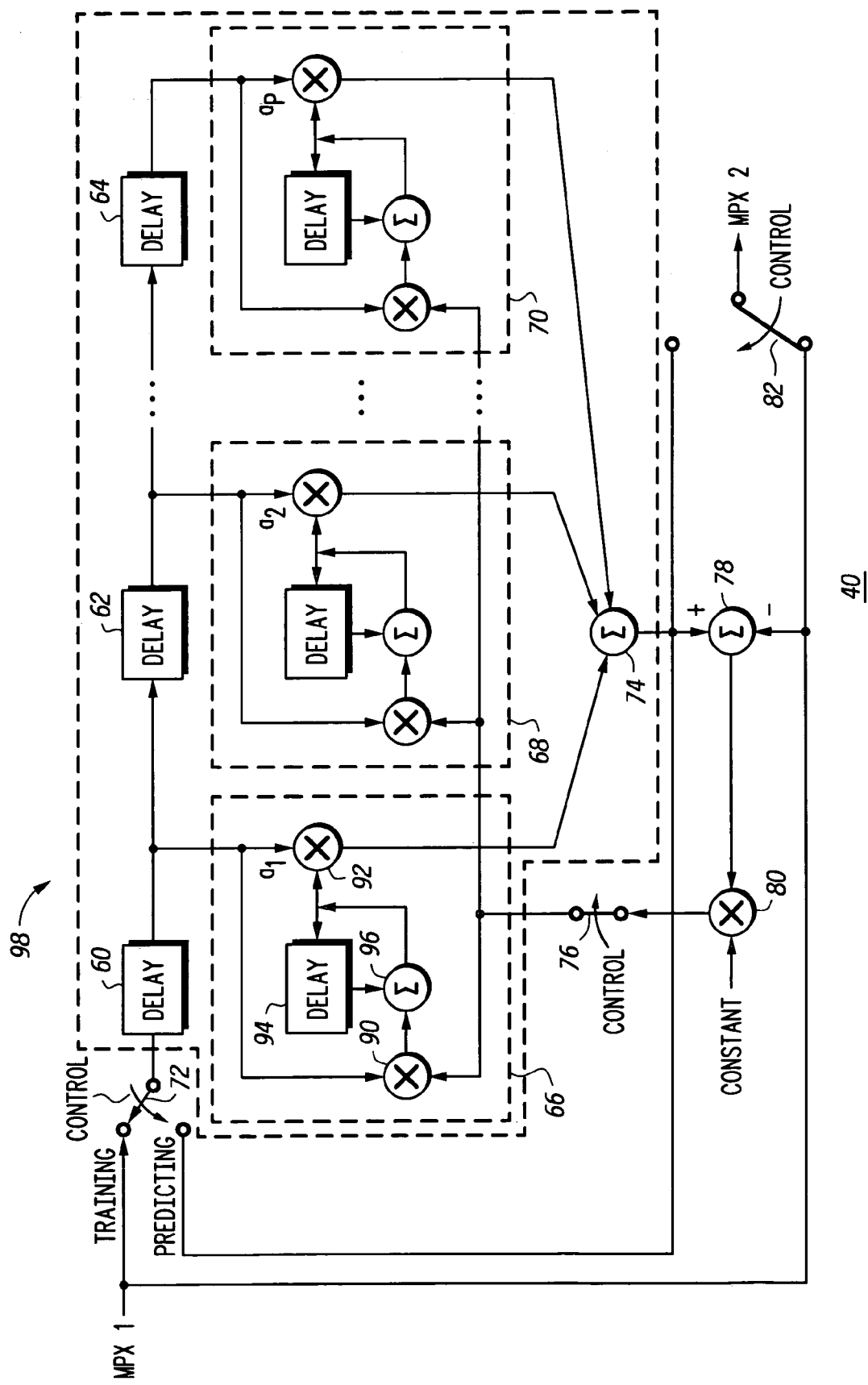
FIG. 2 illustrates, in block diagram form, the noise blanker of FIG. 1 in more detail.

FIG. 2 illustrates, in block diagram form, noise blanker 40 of FIG. 1 in more detail. Noise blanker 40 includes switches 72, 76, and 82, delay elements 60, 62, and 64, coefficient updaters 66, 68, and 70, summation elements 74 and 78, and multiplier 80. Adaptive filter 98 includes delay elements 60, 62, and 64, coefficient updaters 66, 68, and 70 and summation element 74. MPX1 signal is provided as an input to switch 72. Switch 72 is controlled by the noise detector CONTROL signal to configure noise blanker 40 for a noise training mode when a noise spike is not present, and a predicting mode when a noise spike is present. Note that switches 72, 76, and 82 are set to training mode in FIG. 2. MPX1 signal is provided to a plurality of series-connected delay elements represented by delay elements 60, 62, and 64. The coefficient updaters, or taps, are each connected to an output terminal of the plurality of delay elements. Coefficient updater 66 includes multipliers 90 and 92, delay element 94, and summation element 96. Input terminals of both of multipliers 90 and 92 are connected to the output of delay element 60. Another input of multiplier 90 is coupled to switch 76. An output of multiplier 90 is connected to an input of summation element 96, and an output of summation element 96 is provided to input terminals of multiplier 92 and delay element 94. An output of delay element 94 is connected to an input of summation element 96. Delay element 94 is used to temporarily store each updated coefficient labeled "$a_1$". Each of the other coefficient updaters 68 and 70 includes elements similar to coefficient updater 66 for updating each of the other coefficients. Note that only 3 coefficient updaters are illustrated in FIG. 2, but the illustrated embodiment of noise blanker 40 includes 30 coefficient updaters like coefficient updater 66.

Noise blanker 40 is an adaptive all-pole predictor used to suppress impulse-type noise effects on audio output in a digitized intermediate frequency (DIF) radio. Noise blanker 40 provides the benefit of better audio quality compared to the prior art noise blankers because the all-pole prediction algorithm more closely approximates the received signal. As illustrated in FIG. 2, noise blanker 40 is a modified polyphase filter structure used to extract ultrasonic noise from a demodulated FM multiplex signal (MPX1) and is used with noise detector 34 to decide whether a signal is corrupted by impulse noise or not. When the signal is not affected by ignition noise, noise blanker 40 is adaptively trained using the uncorrupted signal itself so that a mean-squared-error between the predicted output and the true signal is minimized. On the other hand, when the signal is affected by ignition noise, noise blanker 40 is switched into a prediction mode to generate a segment of a clean signal based on the previous training mode to replace that segment of corrupted original signal. By doing this, the segment of impulse noise affected audio signal is replaced by a predicted clean signal. Noise blanker 40 is intended to be used in a FM/AM radio automobile receiver, but it can also be used in any other type of radio receiver systems that are subject to being affected by impulse-type of interference.

An all-pole model is used to model the MPX signal at 240 KS/s. Different from a traditional method to obtain those model coefficients, an adaptive algorithm is designed to adjust the model coefficients dynamically.

The spike-corrupted MPX signal at 240 KS/s is can be represented by $$y(n) = d(n) + \text{Spike}(n), \qquad (1)$$

where d(n) is the original MPX signal from the transmitter, and Spike(n) is the impulse noise caused by ignition noise.

The function of noise detector 34 is to detect when the original MPX signal is corrupted by ignition noise and the function of noise blanker 40 is to replace the spike-distorted signal with samples predicted from previously received good samples.

If we use an all-pole model to model the MPX signal, we have $$\hat{y}(n) = b(0) \times \delta(n) + \sum_{i=1}^{p} a(i) \times \hat{y}(n-i), \qquad (2)$$

where $\{a(i), i=1, 2, \ldots p\}$ are the model coefficients that are updated by coefficient updaters 66, 68, and 70. Minimized Mean Squared Error (MMSE) is used in noise blanker 40, $$\{a(i), i = 1, 2, \ldots p\} \text{ to minimize } J = \frac{1}{2}E(|\hat{y}(n) - y(n)|^2) \quad (3)$$

where y(n) is the MPX signal as shown above. To find the solution, set the partial derivative with respect to a(i) to zero as shown in equations 4 and 5.

$$\frac{\partial J}{\partial a(i)} = \frac{\partial E(|\hat{y}(n) - y(n)|^2)}{\partial a(i)} = 0, \quad i = 1, 2, \ldots p \quad (4)$$

$$\frac{\partial J}{\partial a(i)} = E[(\hat{y}(n) - y(n)) \times \hat{y}(n - i)] = 0, \quad i = 1, 2, \ldots p \quad (5)$$

To simplify the digital signal processor (DSP) calculations, an adaptive algorithm is used to adjust the model by updating the coefficients as illustrated in the following equation 6.

$$a_{n+1}(i) = a_n(i) - \mu \times \frac{\partial J}{\partial a(i)}, \quad i = 1, 2, \ldots p \quad (6)$$

In the above equation 6, $\mu$ is a constant. Also, to reduce the costs, we can use sample-mean instead of statistic mean to approximate equation (5), $$\frac{\partial J}{\partial a(i)} \approx (\hat{y}(n) - y(n)) \times \hat{y}(n - i), \quad i = 1, 2, \ldots p \quad (7)$$

So updating equation (6) with equation (7) becomes $$a_{n+1}(i) = a_n(i) - \mu \times (\hat{y}(n) - y(n)) \times \hat{y}(n-i) \quad (8)$$

When there is not any impulse interference present to cause noise blanker 40 to operate in prediction mode, control signal CONTROL causes noise blanker 40 to operate in training mode. In training mode, the original MPX signal is used to train the All-Pole Model as implemented in FIG. 2. The training equation (9) is shown below.

$$\hat{y}(n) = \sum_{i=1}^{p} a_n(i) \times y(n - i), \quad (9)$$

$$a_{n+1}(i) = a_n(i) - \mu \times [\hat{y}(n) - y(n)] \times y(n - i)$$

In equation 9, function $\{y(n)\}$ is the original received MPX signal at 240 KS/s, and $\{a_n(i), i=1, 2, \ldots p\}$ are the model coefficients at the time index n. When spikes are detected by the noise detector 34, the trained All-Pole model starts to generate predictions to replace the originally corrupted MPX signal samples, where $$\hat{y}(n) = \sum_{i=1}^{p} a(i) \times \hat{y}(n - i) \quad (10)$$

Figure 3:
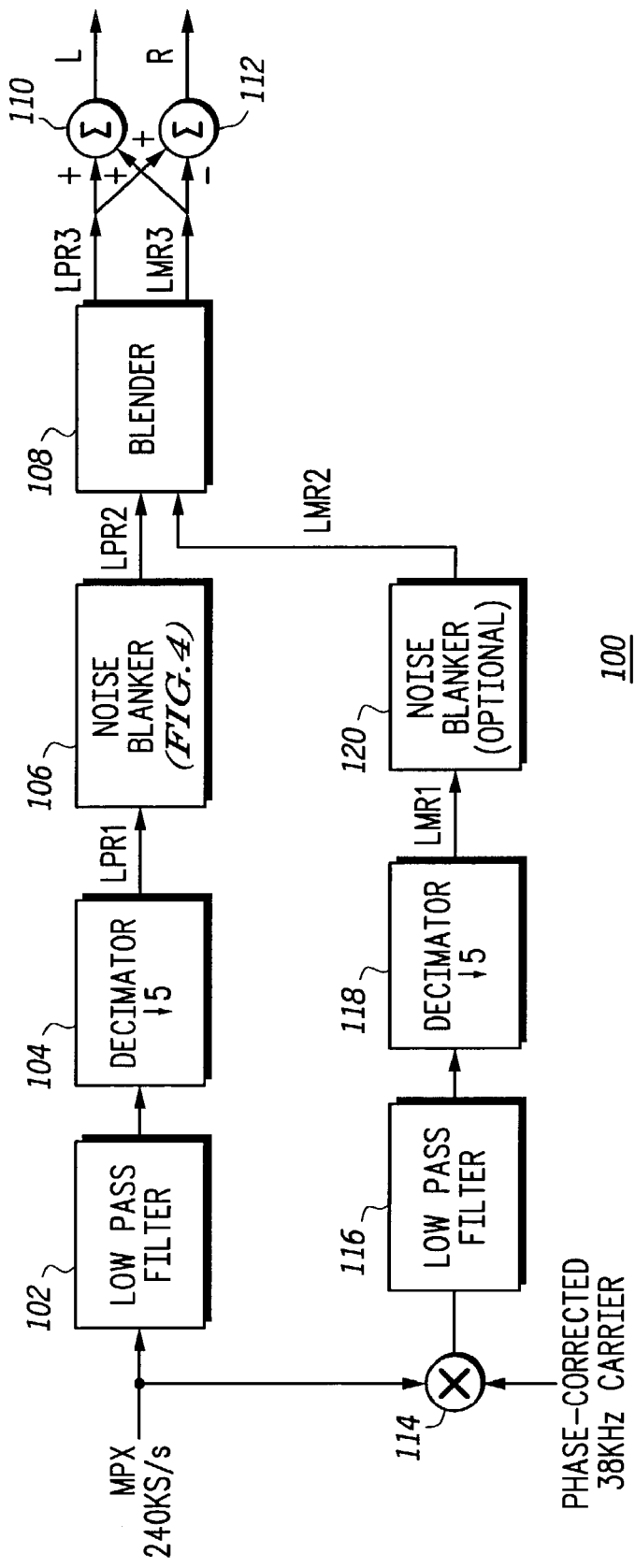
FIG. 3 illustrates, in block diagram form, a noise controller in accordance with a second embodiment of the present invention.

FIG. 3 illustrates, in block diagram form, noise controller 100 in accordance with a second embodiment of the present invention. Noise controller 100 includes lowpass filters 102 and 116, decimators 104 and 118, noise blankers 106 and 120, blender 108 and summation elements 110 and 112. In noise controller 100, a multiplex signal MPX is provided to an input of LPF 102 at a data rate of 240 KS/s (kilo samples per second) and to an input of multiplier 114. Signal MPX is decimated, or downsampled, by five with decimators 104 and 118 to produce left plus right (LPR) and left minus right (LMR) signals, where "left" and "right" refer to audio channels. The LPR signal is provided as an input to noise blanker 106. As an option, a noise blanker 120 can be included after decimator 118 for signal LMR1, but may be unnecessary in most embodiments because the LMR2 signal from noise blanker 120 is mostly removed, or attenuated, by blender 108 and has little effect on the final signal. Blender 108 receives signal LPR2 from noise blanker 106, and provides signals LPR3/LMR3 as outputs to both of summation elements 110 and 112. Summation elements 110 and 112 then provide separate left and right output signals labeled "L" and "R", respectively.

Generally, noise blanker 106 requires less complexity to implement than noise blanker 40 because the sampling rate of noise blanker 106 is much lower than the sampling rate of noise blanker 40. Also, noise blanker 106 provides a multiplex signal with higher fidelity than noise blanker 40 because noise blanker 106 uses lower frequency components than noise blanker 40, and only the audio signal is predicted having relatively low frequencies. The operation of noise blanker 106 will be described in more detail in the discussion of FIG. 4.

Figure 4:
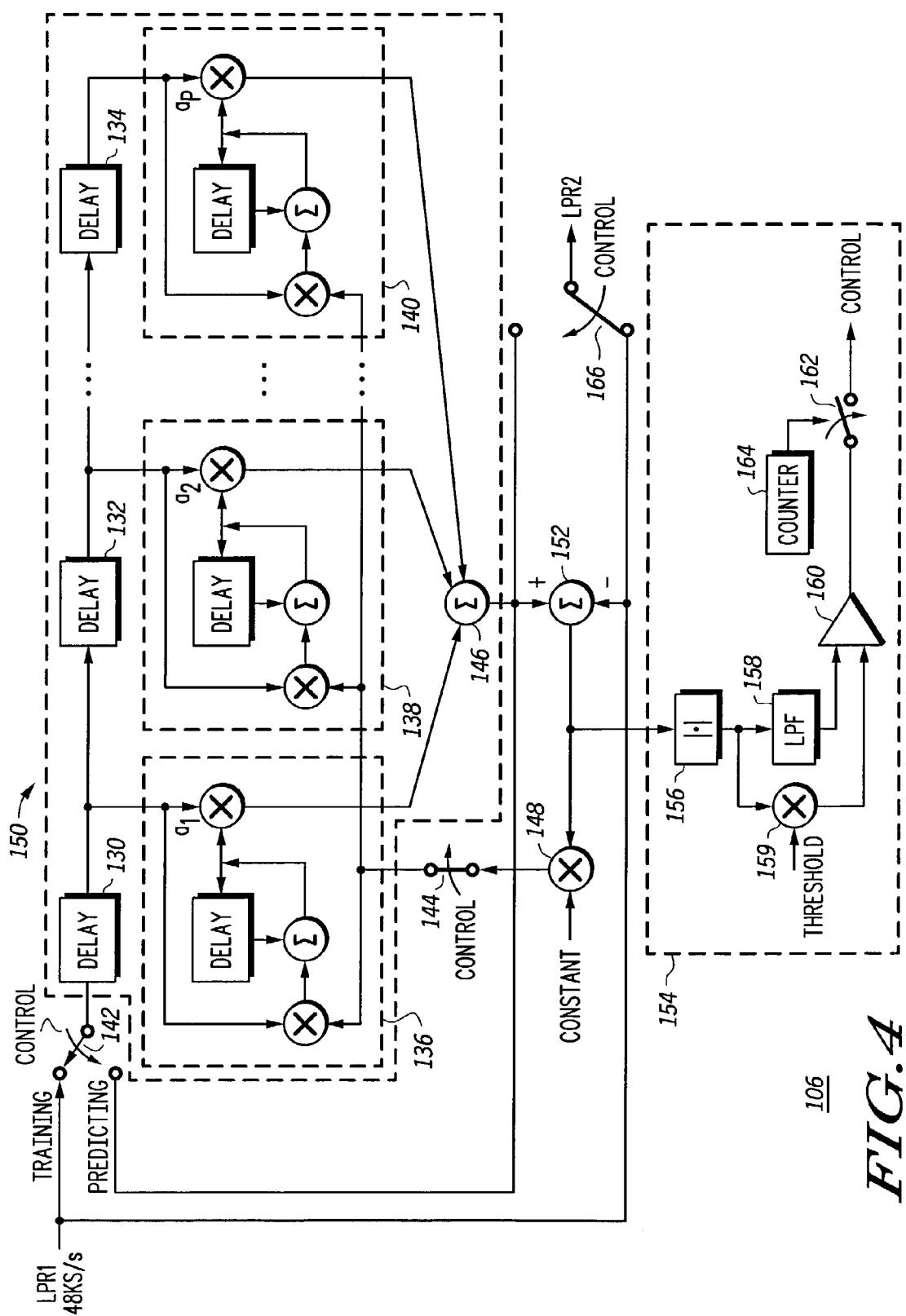
FIG. 4 illustrates, in block diagram form, the noise blanker of FIG. 3 in more detail.

FIG. 4 illustrates, in block diagram form, noise blanker 106 of FIG. 3 in more detail. Noise blanker 106 includes adaptive filter 150, summation element 152, multiplier 148, switches 142, 144, and 166, and noise detector 154. Adaptive filter 150 includes a plurality of series-connected represented by delay elements 130, 132, and 134, a plurality of coefficient updaters represented by coefficient updaters 136, 138, and 140, and summation element 146. Noise detector 154 includes absolute value calculator 156, LPF 158, comparator 160, counter 164, and switch 162.

Generally, noise blanker 106 generates updated coefficients in a manner similar to noise blanker 40. However, instead of detecting ultrasonic noise (USN) to control the training and predicting modes, noise blanker 106 uses a prediction error generated by subtracting an output of the noise blanker from the original input MPX signal. The prediction error is used to detect ignition noise. When there is no ignition noise, the prediction error is a "white noise" type of signal. When ignition noise is present, the noise spikes appear in the error signal because, by their nature, cannot be predicted by noise blanker 40.

Noise blanker 106 generates updated coefficients in the same manner as noise blanker 40. Noise blanker 106 is an adaptive all-pole predictor used to suppress impulse-type noise effects on audio output in a digitized intermediate frequency (DIF) radio. Noise blanker 106 provides the benefit of better audio quality compared to prior art impulse noise blanker as used in FM/AM radio. As illustrated in FIG.

4, noise blanker 106 receives a decimated signal LPR1 and is used with noise detector 154 to decide whether a signal is corrupted by impulse noise or not. When the signal is not affected by impulse noise, noise blanker 106 is adaptively trained using the uncorrupted signal itself so that a mean-squared-error between the predicted output and the true signal is minimized. Switches 142, 144, and 166 are illustrated in the training mode in FIG. 4. On the other hand, when the signal is affected by ignition noise, noise blanker 106 is switched into a prediction mode to generate a segment of a clean signal based on the previous training of the all-pole mode to replace that segment of corrupted original signal. By doing this, an impulse noise affected audio signal is replaced by a predicted clean signal. Noise blanker 106 is intended to be used in a FM/AM radio automobile receiver, but it can also be used in any other type of system affected by impulse-type of interference.

An all-pole model is used to model the LPR1 signal at 48 KS/s. This is different from a traditional method to obtain those model coefficients. An adaptive algorithm is designed to adjust the model, or prediction, coefficients dynamically.

The spike-corrupted LPR1 signal at 48 KS/s is $$y(n)=d(n)+\text{Spike}(n), \tag{11}$$

where d(n) is the original LPR1 signal from the transmitter, and Spike(n) is the impulse noise caused by ignition noise.

The function of noise detector 34 is to detect when the original MPX signal is corrupted by ignition noise and the function of noise blanker 40 is to replace the spike-distorted signal with samples predicted from previously received good samples.

If we use an all-pole model to model the MPX signal, we have, $$\hat{y}(n) = b(0) \times \delta(n) + \sum_{i=1}^{p} a(i) \times \hat{y}(n-i), \tag{12}$$

where {a(i), i=1, 2, . . . p} are the model coefficients that are updated by coefficient updaters 66, 68, and 70. Minimized Mean Squared Error (MMSE) is used in noise blanker 40, and $$\{a(i), i = 1, 2, \ldots p\} \text{ to minimize } J = \frac{1}{2}E(|\hat{y}(n) - y(n)|^2) \tag{13}$$

where y(n) is the MPX signal as shown above. To find the solution, set the partial derivative with respect to a(i) to zero as shown in equations 14 and 15.

$$\frac{\partial J}{\partial a(i)} = \frac{\partial E(|\hat{y}(n) - y(n)|^2)}{\partial a(i)} = 0, \quad i = 1, 2, \ldots p \tag{14}$$

$$\frac{\partial J}{\partial a(i)} = E[(\hat{y}(n) - y(n)) \times \hat{y}(n-i)] = 0, \quad i = 1, 2, \ldots p \tag{15}$$

To simply the digital signal processor (DSP) calculations, an adaptive algorithm is used to adjust the model by updating the coefficients as illustrated in the following equation 16.

$$a_{n+1}(i) = a_n(i) - \mu \times \frac{\partial J}{\partial a(i)}, \quad i = 1, 2, \ldots p \tag{16}$$

In the above equation 16, μ is a constant. Also, to reduce costs, we can use sample-mean instead of statistic mean to approximate equation (15), $$\frac{\partial J}{\partial a(i)} \approx (\hat{y}(n) - y(n)) \times \hat{y}(n-i), \quad i = 1, 2, \ldots p \tag{17}$$

So updating equation (16) with equation (17) provides $$a_{n+1}(i) = a_n(i) - \mu \times (\hat{y}(n) - y(n)) \times \hat{y}(n-i) \tag{18}$$

When there is not any impulse interference causing noise blanker 106 to operate in prediction mode, control signal CONTROL causes noise blanker 106 to operate in training mode. In training mode, the original LPR1 signal is used to train the All-Pole Model as implemented in FIG. 4. The training equation (19) is shown below.

$$\hat{y}(n) = \sum_{i=1}^{p} a_n(i) \times y(n-i), \tag{19}$$

$$a_{n+1}(i) = a_n(i) - \mu \times [\hat{y}(n) - y(n)] \times y(n-i)$$

where {y(n)} is the original received LPR1 signal at 48 KS/s, {$a_n(i)$, i=1, 2, . . . p} are the model coefficients at the time index n. When spikes are detected by the noise detector 154, the trained All-Pole model starts to generate predictions to replace the originally corrupted MPX signal samples, where $$\hat{y}(n) = \sum_{i=1}^{p} a(i) \times \hat{y}(n-i) \tag{20}$$

To detect noise spikes, noise detector 154 takes the prediction error from the output of summation element 152. An absolute value calculation is performed by absolute value calculator 156. The result is provided to a first input of comparator 160 via LPF 158 and also directly to a second input of comparator 160 via a threshold multiplier 159. The threshold value THRESHOLD is a predetermined noise threshold. The output of LPF 158 is compared to the predetermined noise threshold THRESHOLD to detect the present of noise. If the output of LPF 158 is higher than the predetermined threshold, then noise is not present and a control signal labeled CONTROL, having a predetermined logic state, is provided through a switch 162 to control switches 142 and 166. As illustrated in FIG. 4, when noise is not present, switches 142, 144, and 166 are positioned and illustrated in FIG. 4 and noise blanker 106 is in the training mode. When noise blanker 106 is in the training mode, signal LPR1 is passed through and is simply output as LPR2. However, when noise is detected by noise detector 154, as determined by the output of LPF 158 being lower than the predetermined noise threshold, control signal CONTROL is provided at a different logic state, causing switches 142 and 166 to switch to the other terminal, and switch 144 is opened placing noise blanker 106 in prediction mode. In prediction mode, noise blanker 106 replaces the noisy segment of LPR2 with a predicted clean version of LPR2. Counter 164 and switch 162 prevent control signal CONTROL from being asserted too frequently. If predicted segments are substituted for original segments too frequently, then output signal LPR2 becomes too distorted.

Note that in the illustrated embodiments the noise controllers are implemented in a combination of hardware and software, where the software is run on a digital signal processor. However, in other embodiments, the noise controllers can be implement in hardware or in software.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A noise control circuit comprising:
    a first switch having a first terminal for receiving a sampled signal, a second terminal, a third terminal and a control terminal for receiving a control signal;
    an adaptive filter having an input coupled to the second terminal of the first switch, the adaptive filter having a plurality of coefficient updaters, an output of each of the plurality of coefficient updaters being summed to provide a predicted output signal that is connected to the third terminal of the first switch;
    a second switch having a first terminal coupled to the third terminal of the first switch, a second terminal coupled to the first terminal of the first switch, a third terminal coupled to an output of the noise control circuit, and a control terminal for receiving the control signal; and
    noise detecting circuitry for providing the control signal if noise associated with the sampled signal exceeds a predetermined threshold, the noise control circuit providing the sampled signal as an output signal of the noise control circuit when the control signal is not asserted and the noise control circuit providing the predicted output signal as the output signal of the noise control circuit when the control signal is asserted.

2. The noise control circuit of claim 1 wherein the adaptive filter generates an error signal by forming a difference between the sampled signal and the predicted output signal, the error signal being used to adaptively update filter coefficients of the adaptive filter to provide an accurate value for the predicted output signal.

3. The noise control circuit of claim 1 further comprising:
    a polyphase filter for receiving an input signal and separating the input signal into a noise component signal and the sampled signal, the noise component signal being coupled to the noise detecting circuitry for comparison with a threshold value to determine whether the control signal should be asserted or not.

4. The noise control circuit of claim 1 wherein the adaptive filter is an adaptive all-pole predictor and each of the plurality of coefficient updaters receives a predetermined sample of the sampled signal determined by a plurality of delay elements.

5. The noise control circuit of claim 1 wherein the noise detecting circuitry further comprises an absolute value calculator for providing a magnitude of noise error associated with the sampled signal so that the control signal is asserted regardless of direction of transition of noise when the predetermined threshold is exceeded.

* * * * *